United States Patent [19]
Kimura

[11] Patent Number: 5,909,136
[45] Date of Patent: Jun. 1, 1999

[54] QUARTER-SQUARE MULTIPLIER BASED ON THE DYNAMIC BIAS CURRENT TECHNIQUE

[75] Inventor: Katsuji Kimura, Tokyo, Japan

[73] Assignee: NEC Corporation, Tokyo, Japan

[21] Appl. No.: 08/928,452

[22] Filed: Sep. 12, 1997

Related U.S. Application Data

[63] Continuation of application No. 08/699,850, Aug. 20, 1996, abandoned, which is a continuation of application No. 08/509,238, Jul. 31, 1995, abandoned.

[30] Foreign Application Priority Data

Aug. 3, 1994 [JP] Japan .................................. 6-201485

[51] Int. Cl.$^6$ ........................................................ H03F 3/45
[52] U.S. Cl. .......................... 327/356; 327/563; 327/357; 327/349; 330/253
[58] Field of Search .................................... 327/356, 357, 327/355, 359, 349, 350, 105, 346, 352, 563; 330/253, 257

[56] References Cited

U.S. PATENT DOCUMENTS

| | | | |
|---|---|---|---|
| 4,965,528 | 10/1990 | Okanobu ................................. | 330/252 |
| 5,107,150 | 4/1992 | Kimura ................................... | 327/349 |
| 5,151,625 | 9/1992 | Zarabadi et al. ........................ | 327/356 |
| 5,187,682 | 2/1993 | Kimura ................................... | 327/356 |
| 5,357,149 | 10/1994 | Kimura . | |
| 5,381,113 | 1/1995 | Kimura ................................... | 330/253 |
| 5,438,296 | 8/1995 | Kimura ................................... | 327/356 |
| 5,481,224 | 1/1996 | Kimura . | |
| 5,485,119 | 1/1996 | Kimura ................................... | 327/349 |
| 5,500,623 | 3/1996 | Kimura . | |
| 5,523,717 | 6/1996 | Kimura . | |
| 5,552,734 | 9/1996 | Kimura . | |
| 5,576,653 | 11/1996 | Kimura . | |
| 5,578,965 | 11/1996 | Kimura . | |
| 5,581,210 | 12/1996 | Kimura . | |

OTHER PUBLICATIONS

"Microelectronic Circuits", Sedra and Smith, third edition, pp. 220–223 and 308–312, 1991.
"CMOS Temperature–Stable Linearised Differential Pair", Dias et al., Electronics Letters, vol. 28, No. 25, Dec. 1992.
"Linearity Improvement of CMOS Transconductors for Low Supply Applications", Chen et al., Electronics Letters, vol. 29, No. 12, Jun. 1993.
IEEE Journal of Solid–State Circuits,"Adaptive Biasing CMOS Amplifiers"; Degrauwe et al., vol. SC–17, No. 3, Jun. 1982.

(List continued on next page.)

*Primary Examiner*—Timothy P. Callahan
*Assistant Examiner*—Eunjia Shin
*Attorney, Agent, or Firm*—Sughrue, Mion, Zinn, Macpeak & Seas, PLLC

[57] ABSTRACT

A four-quadrant multiplier which is constructed from two squaring circuits using the quarter-square technique and is suitable for an integrated circuit (IC) or a large-scale integrated circuit (LSI). Each of the squaring circuits has a pair of differential input terminals, an output terminal and two differential pairs. Each of differential pairs is composed of first and second transistors whose sources or emitters are connected in common, receives a differential input voltage impressed between the differential input terminals. In each differential pair, a constant current source of a predetermined current value and an dynamic bias current source are inserted in parallel between the common sources or the common emitters and the grounding point. The dynamic bias current source is realized by a current mirror circuit which outputs current equal to the drain current or the collector current of the second transistor. Therefore, the tail current of each differential pair is current given by the sum of the output current of the second transistor and the predetermined constant current. The output current of each squaring circuit is represented by the sum of the drain currents or the collector currents of the second transistors of both of the differential pairs.

9 Claims, 5 Drawing Sheets

OTHER PUBLICATIONS

"A Unified Analysis of Four–Quadrant Analog Multipliers Consisting of Emitter and Source–Coupled Transistors Operable on Low Supply Voltage"; IEICE Transactions on Electronics E76–c(1993) May, No. 5, Katsuji Kimura, May 1993.

Katsuji Kimura, "A Dynamic Bias Current Technique for a Bipolar Exponential–Law . . . Supply Voltage", *IEICE Trans. Fundamentals*, vol. E77–A, No. 11, Nov., 1994, pp. 1922–1928.

Katsuji Kimura, "A Unified Analysis of Four–Quadrant . . . Operable on Low Supply Voltage", *IEIEE Trans. Electronics*, vol. E76–C, No. 5, May, 1993, pp. 714–738.

QUARTER-SQUARE MULTIPLIER BASED ON THE DYNAMIC BIAS CURRENT TECHNIQUE

This is a Continuation of application Ser. No. 08/699,850 filed on Aug. 20, 1996 now abandoned, which is a continuation of prior application Ser. No. 08/509,238 filed Jul. 31, 1995, now abandoned.

BACKGROUND OF THE INVENTION

1. Field of the Invention

The present invention relates to a four-quadrant multiplier which multiplies two analog signals, and particularly to a multiplier constructed as a semiconductor integrated circuit using MOS (Metal Oxide Semiconductor) transistors or bipolar transistors.

2. Description of the Related Art

Multipliers are indispensable function blocks in the field of analog signal processing, and multipliers of a wide variety of circuit configurations have been proposed, including multipliers of circuit configuration suitable for incorporation in semiconductor integrated circuits (IC) or large-scale integrated circuits (LSI).

In recent years, with the advances in micro-scaled circuit patterns in the manufacture of IC and LSI, the power voltage of IC and LSI has fallen to 3.3 V or even 3 V from the usual conventional level of 5 V, therefore calling for multipliers that can operate at lower voltage. In addition, the growing recognition that CMOS (Complementary MOS) technology is best suited for LSI fabrication in turn calls for a circuit technology for realizing multipliers using a CMOS process.

However, multipliers that have been proposed to date do not in principle allow low-voltage operation, and moreover, have the drawback that satisfactory multiplier operation is possible over a narrow range of input voltage. The applicant of the present invention has proposed various types of four-quadrant multipliers that allow low-voltage operation, and moreover, provide excellent linearity over a wider range of input voltage (IEICE Transactions on Electronics, Vol. E76-C, No. 5, pp. 714–737, May 1993). The inventor has further endeavored to broaden the range of input operation voltage.

SUMMARY OF THE INVENTION

The object of the present invention is to provide a four-quadrant multiplier that allows low-voltage operation and that moreover has excellent linearity over a wide range of input voltage.

The object of the present invention can be achieved by a four-quadrant multiplier that inputs a first signal voltage and a second signal voltage, the second signal voltage being composed of a non-inverted voltage and an inverted voltage, and that outputs a differential current that corresponds to the product of the first signal voltage and the second signal voltage; the multiplier having a first and a second squaring circuit, each of the squaring circuit having a pair of differential input terminals and outputting current based on differential voltage impressed between the differential input terminals; wherein the first squaring circuit takes as differential inputs the first signal voltage and the inverted voltage, the second squaring circuit takes as differential inputs the first signal voltage and the non-inverted voltage, and the differential current is the difference between the current outputted by the first squaring circuit and the current outputted by the second squaring circuit; each of the squaring circuits is provided with a first differential pair that is composed of first and second transistors that takes as differential input the differential voltage, and a second differential pair that is composed of third and fourth transistors that takes as differential input the differential voltage, wherein, in each of the squaring circuits, the first differential pair is driven by electric current given by the sum of the output current of the second transistor and constant current of a predetermined value, the second differential pair is driven by electric current given by the sum of output current of the third transistor and constant current of the predetermined value, and the output current of that squaring circuit is given by the sum of the output current of the second transistor and the output current of the third transistor.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

Figure 1:
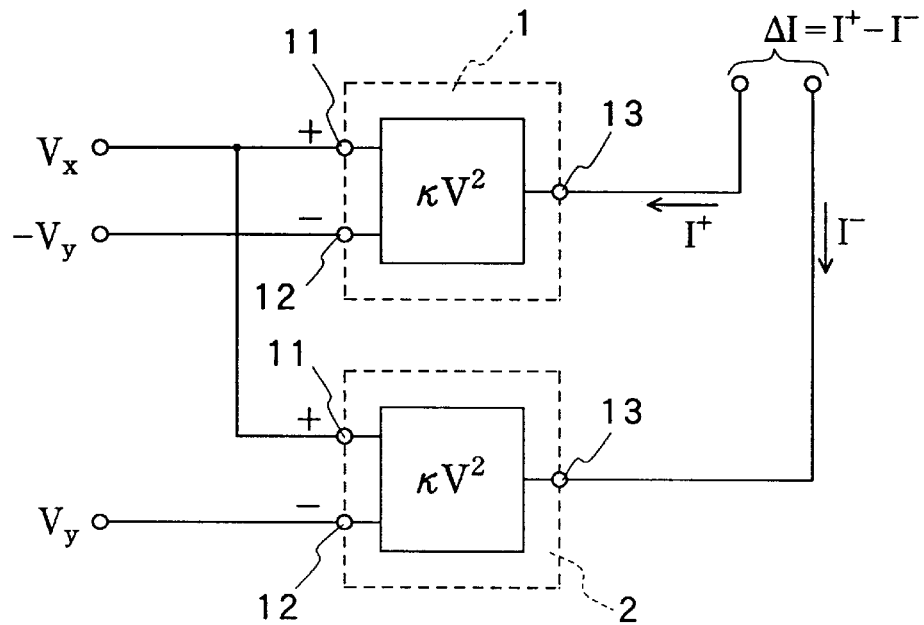
FIG. 1 is a block diagram showing the basic concept of a four-quadrant multiplier composed by combining two squaring circuits.

As shown in FIG. 1, the four-quadrant multiplier according to the present invention is constructed using two squaring circuits 1, 2 having identical characteristics. Each of the squaring circuits 1, 2, is provided with one pair of input terminals 11, 12 and one output terminal 13, and outputs from the output terminal 13 an output current proportionate to the square of the value of input voltage $V_i$ impressed between input terminals 11, 12. As will be explained hereinbelow, the input/output characteristics of the squaring circuits need not be strictly a square-law characteristic, but need only approximate a square-law characteristic within a prescribed error range. The squaring circuits used in the present invention may therefore imply circuits having an input/output characteristic that is, for example, exponential, as long as the circuit can be seen to have a square-law characteristic within a prescribed range.

A first signal and a second signal are supplied to the multiplier as input signals. The first signal is represented as voltage $V_x$, and the second signal is a pair of differential signals represented by non-inverted voltage $V_y$ and inverted voltage $-V_y$. The first signal (voltage $V_x$) is supplied to (+) input terminals 11 of both squaring circuits 1, 2. Of the voltages making up the second signal, inverted voltage $-V_y$ is supplied to (−) input terminal 12 of first squaring circuit 1 and non-inverted voltage $V_y$ is supplied to (−) input terminal 12 of second squaring circuit 2. Therefore, if the output current of first squaring circuit 1 and second squaring circuit 2 are represented as $I^+$ and $I^-$, respectively, the output current $\Delta I$ of this multiplier is given by the difference between these two currents $I^+$ and $I^-$, i.e., $\Delta I = I^+ - I^-$.

The art for realizing a multiplier by using two squaring circuits is therefore known as the quarter-square technique. Here, by finding for two signals the difference between the square of the added signals and the square of the differential signal, the quarter-square technique focuses on obtaining the product term of the two signals. If the transconductance parameter of each squaring circuit is placed at κ, the output currents $I^+$ and $I^-$ of squaring circuits 1 and 2 are respectively:

$$I^+ = \kappa(V_x + V_y)^2 \tag{1}$$

$$I^- = \kappa(V_x - V_y)^2 \tag{2}$$

Accordingly, the output current $\Delta I$ of the multiplier is given by:

$$\begin{aligned}\Delta I &= I^+ - I^- \\ &= \kappa(V_x + V_y)^2 - \kappa(V_x - V_y)^2 \\ &= 4\kappa V_x V_y\end{aligned} \tag{3}$$

As is clear from equation (3), if each squaring circuit conforms to a square-law characteristic, a linearity as a multiplier is ensured. Even for a case in which a reference voltage $V_R$ is determined and the first signal and second signal are defined from this reference voltage $V_R$, the reference voltage $V_R$ does not influence equations (1)–(3) because differential voltages are inputted to each squaring circuit 1, 2. Accordingly, by determining a suitable reference voltage $V_R$, this multiplier enables operation at a single power source without sacrificing linearity. Furthermore, even if a uniform offset component unaffected by output current value is equally included in both output currents $I^+$ and $I^-$ of each squaring circuit 1, 2, i.e., even if the input/output characteristic of each squaring circuit diverges from a square-law characteristic by the amount of this offset component, the offset component will not affect the output current $\Delta I$ of the multiplier.

Embodiments of the present invention will next be described through an explanation of the actual construction of squaring circuit used in a multiplier of the present invention.

Figure 2:
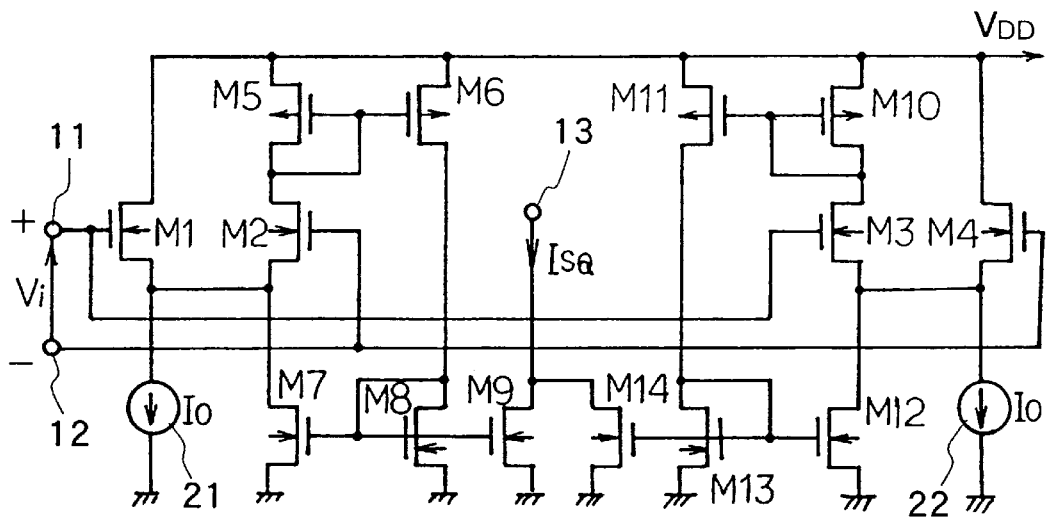
FIG. 2 is a circuit diagram of a MOS squaring circuit used in the four-quadrant multiplier of the first embodiment of the present invention.

In the first embodiment, squaring circuits, 1, 2 are constructed using MOS transistors. FIG. 2 shows a squaring circuit of CMOS configuration using MOS transistors. This MOS squaring circuit is provided with a first differential pair made of NMOS transistors M1, M2 and a second differential pair made of NMOS transistors M3, M4. The characteristics of transistors M1–M4 are essentially identical. The gates of transistors M1, M3 are connected to (+) input terminals 11, and the gates of transistors M2, M4 are connected to (−) input terminals 12. The sources of transistors M1, M2 are connected in common, and between these common sources and the grounding point, first constant-current source 21 and NMOS transistor M7 are inserted in parallel. Similarly, the sources of transistors M3 and M4 are connected in common, and between these common sources and the grounding point, second constant-current source 22 and NMOS transistor M12 are inserted in parallel. First and second constant-current sources 21, 22 have identical characteristics at current value $I_O$.

The drains of transistors M1, M4 are directly connected to power source $V_{DD}$. PMOS transistors M5, M10 are inserted between the drains of transistors M2, M3, respectively, and power source $V_{DD}$. The sources of PMOS transistors M6, M11 are connected to power source $V_{DD}$. Transistors M5, M6 constitute a first current mirror circuit, and the gates of transistors M5, M6 are connected to the drain of transistor M5. Similarly, transistors M10, M11 constitute a second current mirror circuit, and the gates of transistors M10, M11 are connected to the drain of transistor M10.

Transistors M8, M9, M13, and M14 with grounded sources are additionally provided. Transistors M7, M8, and M9 constitute a third current mirror circuit, and the drain of transistor M8 is connected to the drain of transistor M6. The gates of transistors M7, M8, and M9 are connected to the drain of transistor M8. Similarly, transistors M12, M13, and M14 constitute a fourth current mirror circuit, and the drain of transistor M13 is connected to the drain of transistor M11. The gates of transistors M12, M13, and M14 are connected to the drain of transistor 13. Further, the drains of transistor M9 and transistor M14 are mutually connected, and the sum of the drain currents $I_{D9}$, $I_{D14}$ of these transistors M9, M14 constitutes the output current $I_{SQ}$ of this squaring circuit.

Essentially, a bootstrapped current loop for the first differential pair is formed by transistor M2 of the first differential pair, the first current mirror circuit, and the third current mirror circuit. Furthermore, transistor M9 is an output transistor of the third current mirror circuit. In the same way, a bootstrapped current loop for the second differential pair is formed by transistor M3 of the second differential pair, the second current mirror circuit and the fourth current mirror circuit. Transistor M14 is an output transistor of the fourth current mirror circuit.

Assuming matched devices on the same semiconductor chip, the channel-length modulation and the body effect can be ignored. In a MOS transistor operating in the saturation region, if the square-law condition is realized between the drain current and the gate-source voltage:

$$I_{Di} = \beta(V_{DSi} - V_{TH})^2 \quad (V_{DSi} \geq V_{TH}) \tag{4}$$

is effected at the i-th transistor. $I_{Di}$ and $V_{DSi}$ are the drain current and gate-source voltage, respectively, of the i-th transistor. $V_{TH}$ is the threshold voltage, and β is the transconductance parameter. If the effective mobility of the carrier is μ, the gate oxide film capacity per unit surface area $C_{OX}$, the gate width W, and the gate length L, the transconductance parameter β is given by:

$$\beta = \mu(C_{OX}/2)(W/L) \tag{5}$$

Here, a differential pair made of two MOS transistors with sources connected in common is considered. If this differential pair is driven by tail current $I_{SS}$, the differential output current $\Delta I_D$ of this differential pair, i.e., the differential of the drain currents, can be given as shown in equation (6). $V_i$ is the voltage impressed between the gates of the two transistors making up the differential pair.

$$\Delta I_D = \beta V_i \sqrt{\frac{2 I_{SS}}{\beta} - V_i^2} \quad \left(|V_i| \leq \sqrt{\frac{I_{SS}}{\beta}}\right) \tag{6}$$

In the first differential pair of the circuit shown in FIG. 2:

$$\Delta I_D = I_{D1} - I_{D2} \quad (7)$$
$$= I_o - I_{D2}$$

$$I_{SS} = I_o + I_{D2} \quad (8)$$

Equation (9) is obtained if $I_{D2}$ is found by substituting equations (7) and (8) into equation (6).

$$I_{D2} = \begin{cases} \beta\left(V_i - \sqrt{\frac{I_o}{\beta}}\right)^2 & \left(V_i \leq \sqrt{\frac{I_o}{\beta}}\right) \\ 0 & \left(V_i \geq \sqrt{\frac{I_o}{\beta}}\right) \end{cases} \quad (9)$$

The driving current of the first differential pair is given by the sum of constant current $I_O$ and a current (i.e, a dynamic bias current) equal to drain current value $I_{D2}$ of transistor M2 of this differential pair. As shown by equation (9), drain current $I_{D2}$, i.e., the dynamic bias current, indicates the square-law characteristic for differential input voltage $V_i$.

The same argument holds true for the second differential pair, drain current $I_{D3}$ similarly indicating a square-law characteristic for input voltage $V_i$. Further, if the connection relationship with the current mirror circuits is considered, the direction of impressed input voltage $V_i$ for the first differential pair is opposite that for the second differential pair.

Output current $I_{SQ}$ of the squaring circuit is the sum of drain current $I_{D9}$ and drain current $I_{D14}$ and is given by:

$$I_{SQ} = I_{D9} + I_{D14} \quad (10)$$
$$= I_{D2} + I_{D3}$$
$$= \beta\left(V_i - \sqrt{\frac{I_o}{\beta}}\right)^2 + \beta\left(-V_i - \sqrt{\frac{I_o}{\beta}}\right)^2$$
$$= \begin{cases} 2\beta\left(V_i^2 + \frac{I_o}{\beta}\right) & \left(|V_i| \leq \sqrt{\frac{I_o}{\beta}}\right) \\ \beta\left(V_i + \sqrt{\frac{I_o}{\beta}}\right)^2 & \left(|V_i| \geq \sqrt{\frac{I_o}{\beta}}\right) \end{cases}$$

Figure 3:
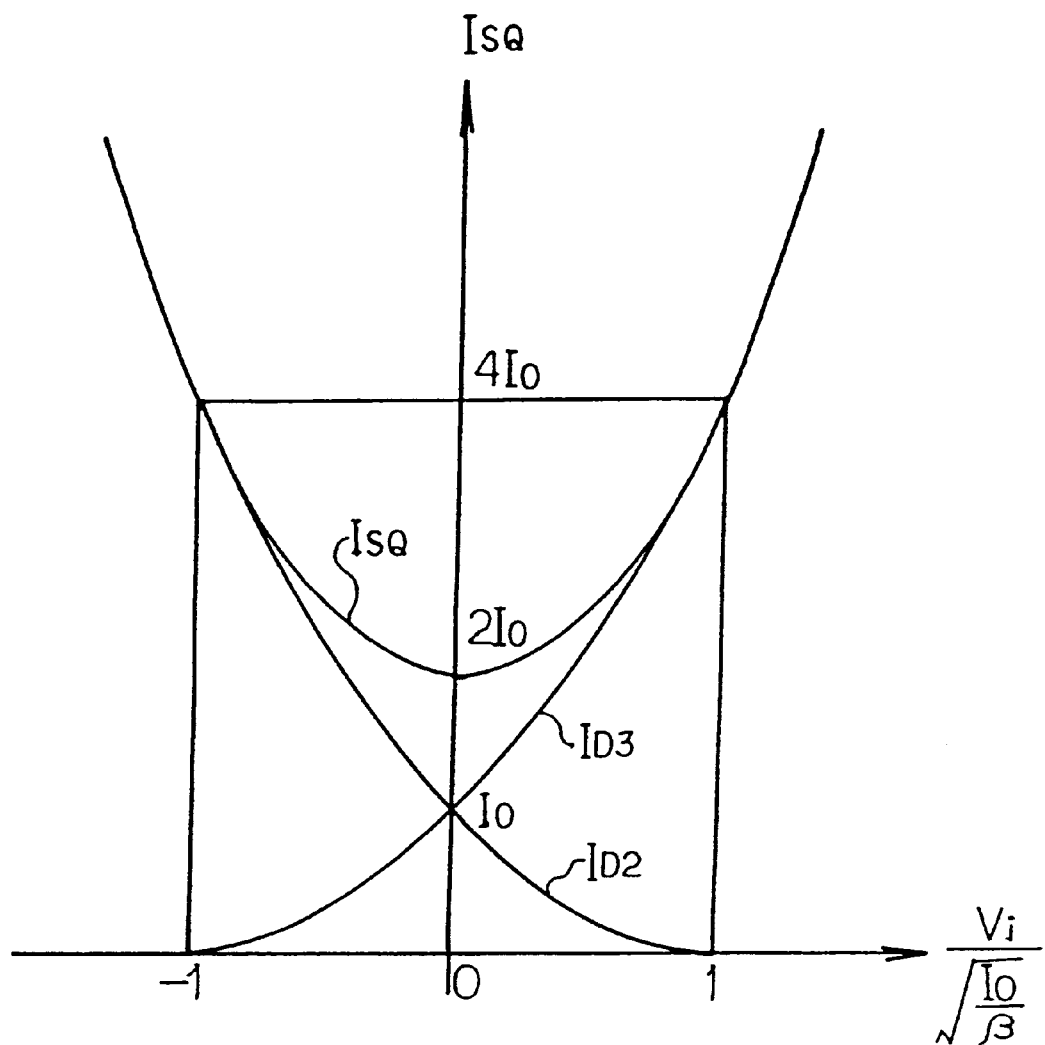
FIG. 3 is a graph showing input/output characteristics of the MOS squaring circuit shown in FIG. 2.

If equation (10) is examined, it can be seen that output current $I_{SQ}$ can be controlled by varying $V_i$ and $I_O$. $V_i$ and $I_O$ are also parameters which can be electrically programmed. Consequently, the squaring circuit shown in FIG. 2 allows easy circuit design and moreover, is suitable for an LSI. FIG. 3 shows the results of investigating input/output characteristics of the squaring circuit based on equation (10). Assuming that input voltage $V_i$ is divided by $(I_O/\beta)^{1/2}$ to acquire the normalized input voltage and the square-law condition is satisfied for a MOS transistor, this squaring circuit exhibits an ideal square-law characteristic at least within the range of ±1 of the normalized voltage. This represents a broader input voltage range than has heretofore been reported for any squaring circuit.

Two squaring circuits such as described hereinabove are combined to construct the multiplier shown in FIG. 1. The input voltage $V_i$ at first squaring circuit 1 is set at $V_i=V_x+V_y$, and the input voltage $V_i$ at second squaring circuit 2 is set at $V_i=V_x-V_y$, and accordingly, the differential output current $\Delta I$ of this multiplier can be given by the following equation (11):

$$\Delta I = 2\{\beta(V_x + V_y)^2 + I_o\} - 2\{\beta(V_x - V_y)^2 + I_o\} \quad (11)$$

$$= \begin{cases} 8\beta V_x V_y & \left(|V_x| + |V_y| \leq \sqrt{\frac{I_o}{\beta}}\right) \\ 2\{\beta(V_x \pm V_y)^2 + I_o\} - \beta\left(|V_x| + |V_y| + \sqrt{\frac{I_o}{\beta}}\right) \\ \quad \left(|V_x \pm V_y| \leq \sqrt{\frac{I_o}{\beta}}, |V_x| + |V_y| \geq \sqrt{\frac{I_o}{\beta}}\right) \\ \beta\left\{(V_x + V_y) + \sqrt{\frac{I_o}{\beta}}\right\}^2 - \beta\left\{(V_x - V_y) + \sqrt{\frac{I_o}{\beta}}\right\}^2 = \beta\left(4V_x V_y + 4V_y\sqrt{\frac{I_o}{\beta}}\right) \\ \quad \left(|V_x \pm V_y| \geq \sqrt{\frac{I_o}{\beta}}\right) \end{cases}$$

Figure 4:
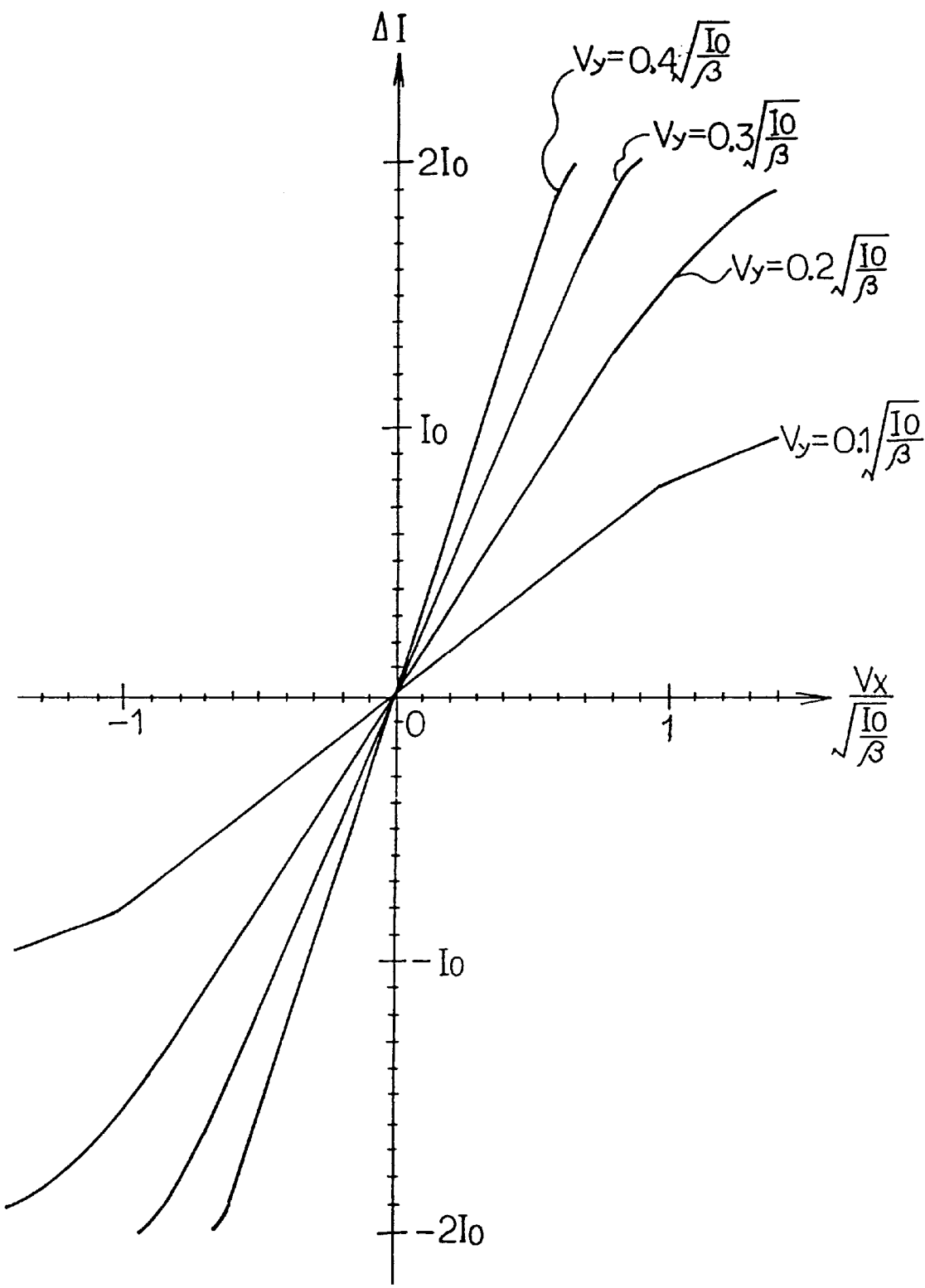
FIG. 4 is a graph showing input/output characteristics of the four-quadrant multiplier of the first embodiment.

FIG. 4 shows input/output characteristics of the MOS four-quadrant multiplier obtained based on equation (11). If the square-law condition of MOS transistors is assumed, the multiplier exhibits an ideal multiplication characteristic within the range $|V_x|+|V_y| \leq (I_O/\beta)^{1/2}$. Essentially, it can be seen that a multiplier according to the present embodiment enables low-voltage operation and provides an excellent linearity as a multiplier over a broad range of each input voltage.

Figure 5:
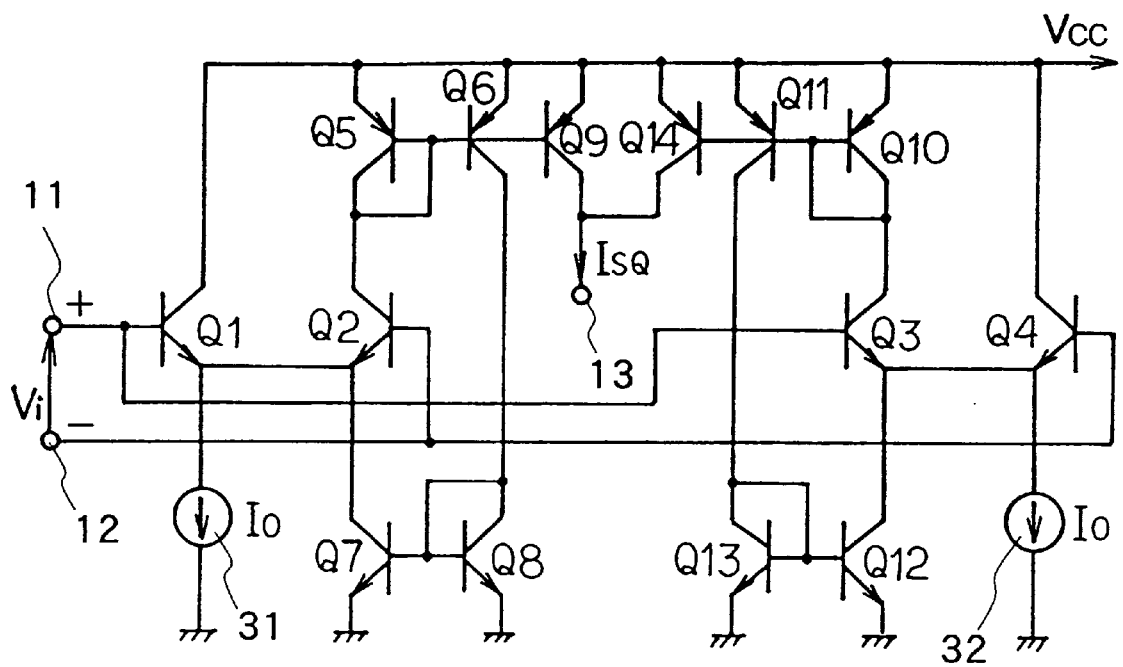
FIG. 5 is a circuit diagram of a bipolar squaring circuit used in the four-quadrant multiplier of the second embodiment of the present invention.

The second embodiment of the present invention will next be explained. In this embodiment, squaring circuits 1, 2 are constructed using bipolar transistors. FIG. 5 shows a squaring circuit using bipolar transistors, and in this bipolar squaring circuit are provided a first differential pair made of NPN transistors Q1, Q2 and a second differential pair made up NPN transistors Q3, Q4. The characteristics of transistors Q1–Q4 are essentially identical. The bases of transistors Q1, Q3 are connected to (+) input terminals 11, and the bases of transistors Q2, Q4 are connected to (−) input terminals 12. The emitters of transistors Q1 and Q2 are connected in common, and between these common emitters and the grounding point a first constant-current source 31 and NPN transistor Q7 are inserted in parallel. Similarly, the emitters of transistors Q3 and Q4 are connected in common, and between these common emitters and the grounding point a second constant-current source 32 and NPN transistor Q12 are inserted in parallel. First and second constant-current sources 31, 32 both have identical characteristics at current value $I_O$.

The collectors of transistors Q1, Q4 are directly connected to power source $V_{CC}$. PNP transistors Q5, Q10 are respectively inserted between the collectors of transistors Q2, Q3 and power source $V_{CC}$. Also provided are PNP transistors Q6, Q9, Q11, and Q14, all having emitters connected to power source $V_{CC}$. Transistors Q5, Q6, and Q9 constitute a first current mirror circuit, and the bases of transistors Q5, Q6 and Q9 are connected to the collector of transistor Q5. In the same way, transistors Q10, Q11 and Q14 constitute a second current mirror circuit, and the bases of transistors Q10, Q11, and Q14 are connected to the collector of transistor Q10. The collectors of transistor Q9 and transistor Q14 are connected in common, and the sum of collector currents $I_{C9}$, $I_{C14}$ of the two transistors Q9, Q14 constitutes the output current $I_{SQ}$ of this squaring circuit.

NPN transistor Q7 together with NPN transistor Q8 constitutes a third current mirror circuit. The emitter of transistor Q8 is grounded and its collector is connected to the collector of transistor Q6. The bases of transistors Q7 and Q8 are connected to the collector of transistor Q8. NPN transistor Q12 together with NPN transistor Q13 constitutes a fourth current mirror circuit. The emitter of transistor Q13 is grounded, and its collector is connected to the collector of transistor Q11. The bases of transistors Q12, Q13 are connected to the collector of transistor Q13.

Essentially, a bootstrapped current loop for the first differential pair is formed from transistor Q2 of the first differential pair, the first current mirror circuit, and the third current mirror circuit. Further, transistor Q9 is an output transistor of the first current mirror circuit. Similarly, a bootstrapped current loop for the second differential pair is formed from transistor Q3 in the pair, the second current mirror circuit, and the fourth current mirror circuit. Transistor Q14 is an output transistor of the second current mirror circuit.

Assuming matched devices on the same semiconductor chip, if the exponential-law relationship is realized between the collector current and the base-emitter voltage of bipolar transistors, then:

$$I_{Ci} = I_S \{exp(V_{BEi}/V_T) - 1\} \quad (12)$$

at the i-th transistor. However, in equation (12), $I_S$ is the saturation current, and $V_T$ is the thermal voltage. Thermal voltage $V_T$ can be given by:

$$V_T = kT/q \quad (13)$$

where Boltzmann's constant k, absolute temperature T, and unit electron charge q.

However, during normal operation of a bipolar transistor, the base-emitter voltage $V_{BE}$ is in the neighborhood of 600 mV. Here, if room temperature (approximately 300 K) is substituted into equations (12) and (13), the value of the exponential part, i.e., $\exp(V_{BE}/V_T)$, is on the order of $10^{10}$, and the "–1" on the right side of equation (12) can be ignored. In the other word, the collector current indicates an exponential-law characteristic.

Here, a differential pair made of two bipolar transistors whose emitters connected in common will be considered. If the matching between the transistors is satisfactory and this differential pair is driven by a tail current $I_{EE}$, the differential output current $\Delta I_C$, i.e., the difference between the collector currents, of this differential pair is given by:

$$\Delta I_C = \alpha_F I_{EE} \tanh(V_i/2V_T) \quad (14)$$

Here, $\alpha_F$ is the DC common-base current gain factor, and $V_i$ is the voltage impressed between the bases of the two transistors. For a transistor obtained by ordinary semiconductor device manufacturing processes, the value of the DC common-base current gain factor $\Delta_F$ is on the order of 0.98–0.99, but $\alpha_F$ will here be considered as $\alpha_F = 1$.

In the first differential pair of the circuit shown in FIG. 5:

$$\Delta I_C = I_{C1} - I_{C2} \quad (15)$$
$$= I_o - I_{C2}$$

$$I_{EE} = I_o + I_{C2} \quad (16)$$

If $I_{C2}$ is found by substituting equations (15) and (16) into equation (14), the following equation (17) is obtained:

$$I_{C2} = I_o \exp\left(-\frac{V_i}{V_T}\right) \quad (17)$$

The driving current of the first differential pair is given by the sum of a current equal to the value of collector current $I_{C2}$ of transistor Q2 of in the pair (i.e., a dynamic bias current) and the constant current $I_O$. As shown in formula 17, the collector current $I_{C2}$, i.e., the dynamic bias current, exhibits an exponential-law characteristic for differential input voltage $V_i$. The same argument holds true for the second differential pair, collector current $I_{C3}$ exhibiting an exponential-law characteristic for input voltage $V_i$. Moreover, if the connection relationship with the current mirror circuits is considered, the direction of impressed input voltage $V_i$ for the first differential pair is opposite that for the second differential pair.

Output current $I_{SQ}$ of the squaring circuit is the sum of collector current $I_{C9}$ and collector current $I_{C14}$, and can be given by the following equation:

$$I_{SQ} = I_{C9} + I_{C14} \quad (18)$$
$$= I_{C2} + I_{C3}$$
$$= I_o \exp\left(-\frac{V_i}{V_T}\right) + I_o \exp\left(\frac{V_i}{V_T}\right)$$
$$= 2 I_o \cosh\left(\frac{V_i}{V_T}\right)$$

Figure 6:
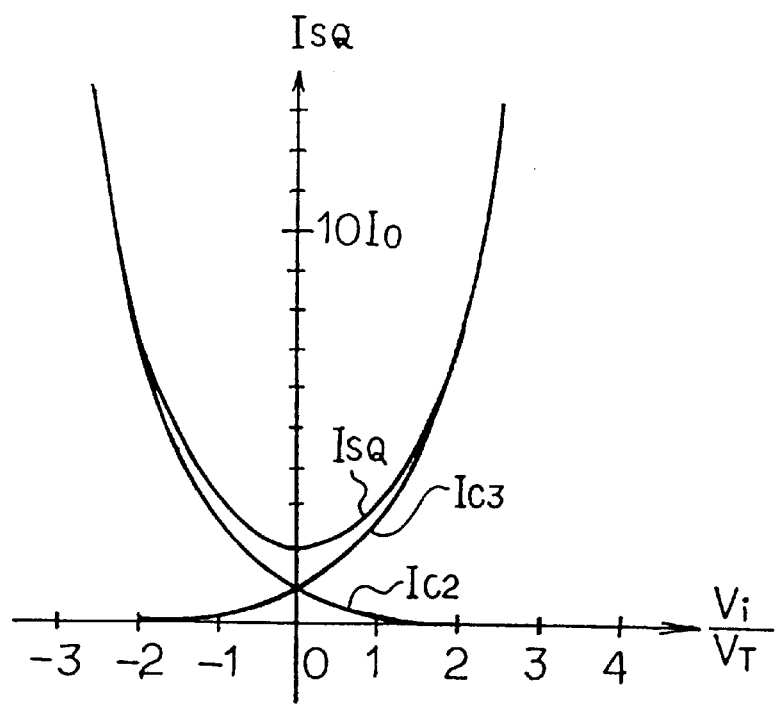
FIG. 6 is a graph showing input/output characteristics of the bipolar squaring circuit shown in FIG. 5.

In contrast to the exponential-law characteristic exhibited by collector current $I_{C2}$ and collector current $I_{C3}$ for input voltage $V_i$, the output current $I_{SQ}$ given by the sum of the two collector currents $I_{C2}$, $I_{C3}$ exhibits a hyperbolic cosine functional characteristic. FIG. 6 shows the input/output characteristic of this squaring circuit. Hyperbolic cosine function $\cosh(x)$ approximates quadratic function $x^2$ when $|x|$ is not large. Accordingly, as shown in FIG. 6, this squaring circuit has a square-law characteristic when the absolute value of input voltage $V_i$ is within the range of about $2V_T$ or less.

Examination of equation (18) shows that output current $I_{SQ}$ can be controlled by varying $V_i$ and $I_O$. Since $V_i$ and $I_O$ are both electrically programmable parameters, the squaring circuit shown in FIG. 5 allows easy circuit design and moreover, is suitable for an LSI.

Assuming that the multiplier shown in FIG. 1 is constructed by combining the two above-described squaring circuits, the input voltage $V_i$ at first squaring circuit 1 is set at $V_i = V_x + V_y$, input voltage $V_i$ at second squaring circuit 2 is set at $V_i = V_x - V_y$, and the differential output current $\Delta I$ of this multiplier is therefore given as shown in equation (19):

$$\Delta I = 2I_o \left\{ \cosh\left(\frac{V_x + V_y}{V_T}\right) - \cosh\left(\frac{V_x - V_y}{V_T}\right) \right\} \quad (19)$$

$$= 4I_o \sinh\left(\frac{V_x}{V_T}\right) \sinh\left(\frac{V_y}{V_T}\right)$$

Figure 7:
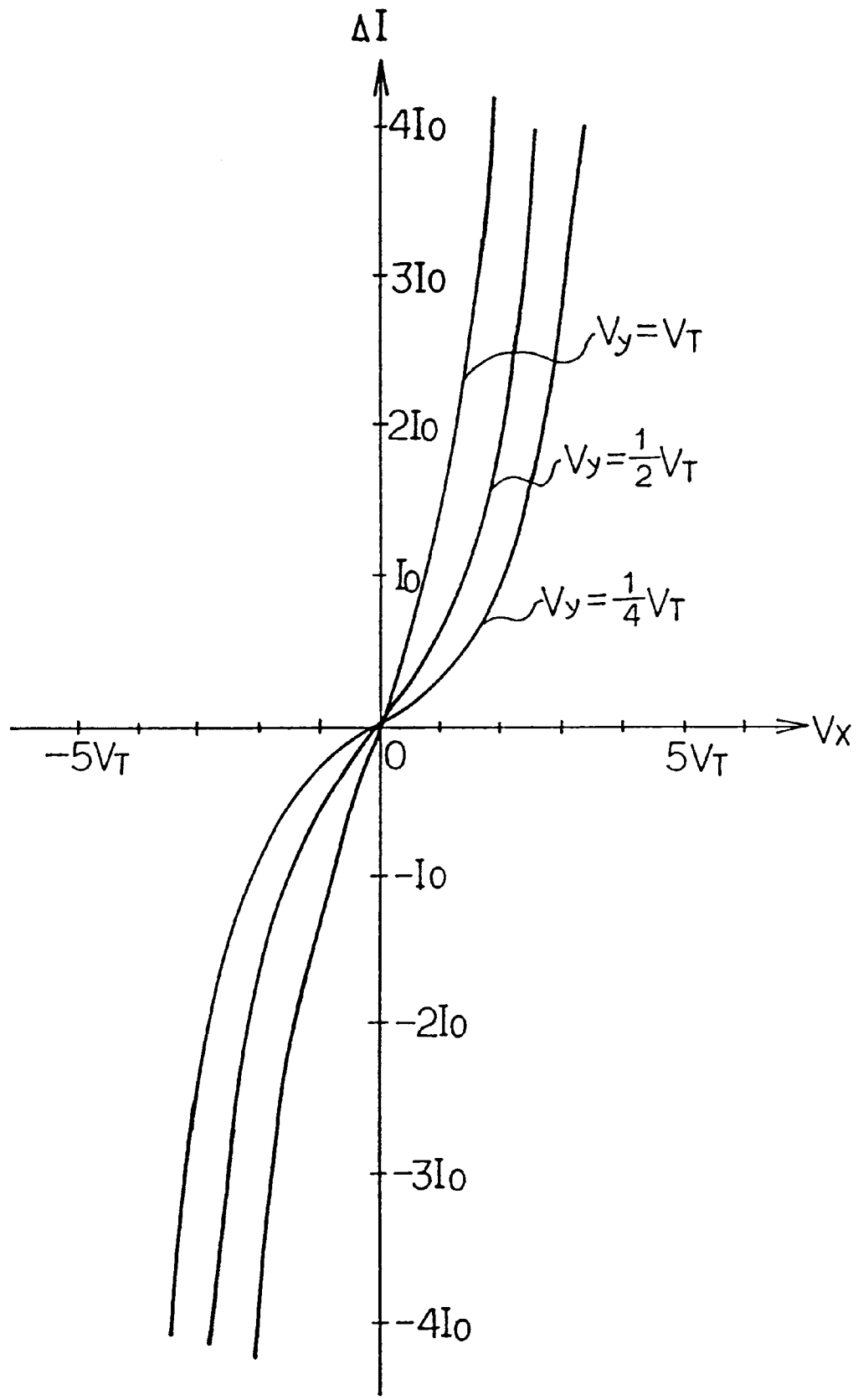
FIG. 7 is a graph showing input/output characteristics of the bipolar four-quadrant multiplier of the second embodiment.

FIG. 7 shows the input/output characteristic of this bipolar four-quadrant multiplier calculated using equation (19). It can be seen that the multiplier of the present embodiment allows low-voltage operation.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A four-quadrant multiplier that inputs a first signal voltage and a second signal voltage, said second signal voltage being composed of a non-inverted voltage and an inverted voltage, and that outputs a differential current that corresponds to a product of said first signal voltage and said second signal voltage, said multiplier comprising:

a pair of squaring circuits, each of said squaring circuits having a pair of differential input terminals and outputting current based on differential voltage impressed between said differential input terminals, wherein one of said squaring circuits takes as differential inputs said first signal voltage and said inverted voltage, the other squaring circuit takes as differential inputs said first signal voltage and said non-inverted voltage, and said differential current is the difference between current outputted by said first squaring circuit and current outputted by said second squaring circuit;

a first differential pair in each of said squaring circuits having a first transistor and a second transistor; and a second differential pair in each of said squaring circuits having a third transistor and a fourth transistor, and wherein, in each of said squaring circuits which uses a dynamic biasing technique and having a current feedback factor of not less than one, said first differential pair operating in a saturation region is driven by a first tail current which is controlled to equal a sum of one of drain and collector currents of said second transistor and constant current of a predetermined value, where when said second transistor is an MOS transistor then said drain current of said second transistor $I_{D2}$ is governed by:

$$I_{D2} = \begin{cases} \beta\left(V_i - \sqrt{(I_o/\beta)^6}\right) & (V_i \le \sqrt{(I_o/\beta)}) \\ 0 & (V_i \ge \sqrt{(I_o/\beta)}) \end{cases}$$

where $\beta$ is the transconductance parameter, $V_i$ is a voltage impressed between the gates of two transistors making up the first differential pair, and $I_O$ is a constant current, and when said second transistor is a bipolar transistor then said collector current of said second transistor $I_{C2}$ is governed by:

$$I_{C2} = I_o \exp(-V_i/V_T)$$

where $V_i$ is a voltage impressed between the bases of two transistors making up the first differential pair, $V_T$ is the thermal voltage, and $I_O$ is a constant current and said second differential pair operating in a saturation region is driven by a second tail current which is controlled to equal a sum of one of drain and collector currents of said third transistor and constant current of said predetermined value, and current outputted by each of said squaring circuits is given by a sum of current outputted by said second transistor and current outputted by said third transistor.

2. The four-quadrant multiplier according to claim 1 wherein each of said transistors is a MOS transistor, sources of said first and second transistors are connected in common, sources of said third and fourth transistors are connected in common, gates of said first and third transistors are connected to one of said differential input terminals, and gates of said second and fourth transistors are connected to the other of said differential input terminals.

3. The four-quadrant multiplier according to claim 1 wherein each of said transistors is a bipolar transistor, emitters of said first and second transistors are connected in common, emitters of said third and fourth transistors are connected in common, bases of said first and third transistors are connected to one of said differential input terminals, and bases of said second and fourth transistors are connected to the other of said differential input terminals.

4. A four-quadrant multiplier that inputs a first signal voltage and a second signal voltage, said second signal voltage being composed of a non-inverted voltage and an inverted voltage, and that outputs a differential current that corresponds to a product of said first signal voltage and said second signal voltage, said multiplier comprising:

a pair of squaring circuits, each of said squaring circuits having a pair of differential input terminals and outputting current based on differential voltage impressed between said differential input terminals, wherein one of said squaring circuits takes as differential inputs said first signal voltage and said inverted voltage, the other squaring circuit takes as differential inputs said first signal voltage and said non-inverted voltage, and said differential current is the difference between current outputted by said first squaring circuit and current outputted by said second squaring circuit; and each of said squaring circuits comprises:

a first differential pair composed of a first MOS transistor and a second MOS transistor, wherein a source of said first MOS transistor is commonly connected to a source of said second MOS transistor;

a second differential pair composed of a third MOS transistor and a fourth MOS transistor, wherein a source of said third MOS transistor is commonly connected to a source of said fourth MOS transistor;

a first constant-current source inserted between a grounding point and said sources of said first and second MOS transistors;

a second constant-current source having a same current value as that of said first constant-current source inserted between said grounding point and said sources of said third and fourth MOS transistors;

a first current mirror circuit that is connected to a drain of said second MOS transistor and outputting current which mirrors a drain current of said second MOS transistor;

a second current mirror circuit that is connected to a drain of said third MOS transistor outputting current which mirrors a drain current of said third MOS transistor;

a third current mirror circuit receiving said current of said first current mirror circuit and having an output transistor inserted between said grounding point and said sources of said first and second MOS transistors of said first differential pair; and a fourth current mirror circuit receiving said current of said second current mirror circuit and having an output transistor inserted between said grounding point and said sources of said third and fourth MOS transistors of said second differential pair, wherein, in each of said squaring circuits which uses a dynamic biasing technique and having a current feedback factor of not less than one, said first differential pair operating in a strong inversion region is driven by a first tail current given by a sum of drain current of said second transistor $I_{D2}$ and constant current of a predetermined value, where said drain current of said second transistor is governed by:

$$I_{D2} = \begin{array}{ll} \beta(V_i - \sqrt{(I_o/\beta)})^6 & (V_i \leq \sqrt{(I_o/\beta)}) \\ 0 & (V_i \geq \sqrt{(I_o/\beta)}) \end{array}$$

where $\beta$ is the transconductance parameter, $V_i$ is a voltage impressed between the gates of two transistors making up the first differential pair, and $I_O$ is a constant current and said second differential pair operating in a strong inversion region is driven by a second tail current given by a sum of drain current of said third transistor and constant current of said predetermined value, and wherein gates of said first and third MOS transistors in each of said squaring circuits are connected to one of said differential input terminals, gates of said second and fourth MOS transistors are connected to the other of said differential input terminals, and the output current of each of said squaring circuits is equivalent to a sum of drain current of said second MOS transistor and drain current of said third MOS transistor.

5. The four-quadrant multiplier according to claim 4 wherein the output current of said squaring circuit is a sum of current outputted by said third current mirror circuit and current outputted by said fourth current mirror circuit.

6. The four-quadrant multiplier according to claim 4 wherein said first, second, third, and fourth MOS transistors are NMOS transistors, said first and second current mirror circuits are constructed from PMOS transistors, and said third and fourth current mirror circuits are constructed from NMOS transistors.

7. A four-quadrant multiplier that inputs a first signal voltage and a second signal voltage, said second signal voltage being composed of a non-inverted voltage and an inverted voltage, and that outputs a differential current that corresponds to a product of said first signal voltage and said second signal voltage, said multiplier comprising:

a pair of squaring circuits, each of said squaring circuits having a pair of differential input terminals and outputting current based on differential voltage impressed between said differential input terminals, wherein one of said squaring circuits takes as differential inputs said first signal voltage and said inverted voltage, the other squaring circuit takes as differential inputs said first signal voltage and said non-inverted voltage, and said differential current is the difference between current outputted by said first squaring circuit and current outputted by said second squaring circuit; and each of said squaring circuits comprises:

a first differential pair composed of a first bipolar transistor and a second bipolar transistor, wherein an emitter of said first bipolar transistor is commonly connected to an emitter of said second bipolar transistor;

a second differential pair composed of a third bipolar transistor and a fourth bipolar transistor, wherein an emitter of said third bipolar transistor is commonly connected to an emitter of said fourth bipolar transistor;

a first constant-current source inserted between a grounding point and said emitters of said first and second bipolar transistors;

a second constant-current source having a same current value as that of said first constant-current source inserted between said grounding point and said emitters of said third and fourth bipolar transistors;

a first current mirror circuit that is connected to a collector of said second bipolar transistor outputting current which mirrors a collector current of said second bipolar transistor;

a second current mirror circuit that is connected to a collector of said third bipolar transistor outputting current which mirrors a collector current of said third bipolar transistor;

a third current mirror circuit receiving said current of said first current mirror circuit and having an output transistor inserted between said grounding point and said emitters of said first and second bipolar transistors of said first differential pair; and a fourth current mirror circuit receiving said current of said second current mirror circuit and having an output transistor inserted between said grounding point and said emitters of said third and fourth bipolar transistors of said second differential pair, wherein, in each of said squaring circuits which uses a dynamic biasing technique and having a current feedback factor of not less than one, said first differential pair operating in a saturation region is driven by a first tail current given by a sum of collector current of said second transistor $I_{C2}$ and constant current of a predetermined value, where said collector current of said second transistor is governed by:

$$I_{C2} = I_O exp(-V_i/V_T)$$

where $V_i$ is a voltage impressed between the bases of two transistors making up the first differential pair, $V_T$ is the thermal voltage, and $I_O$ is a constant current and said second differential pair operating in a saturation region is driven by a second tail current given by a sum of collector current of said third transistor and constant current of said predetermined value, and wherein bases of said first and third bipolar transistors in each of said squaring circuits are connected to one of said differential input terminals, bases of said second and fourth bipolar transistors are connected to the other of said differential input terminals, and the output current of each of said squaring circuits is equivalent to a sum of collector current of said second bipolar transistor and collector current of said third bipolar transistor.

8. The four-quadrant multiplier according to claim 7 wherein the output current of said squaring circuit is a sum of current outputted by said first current mirror circuit and current outputted by said second current mirror circuit.

9. The four-quadrant multiplier according to claim 7 wherein said first, second, third, and fourth bipolar transistors are NPN transistors, said first and second current mirror circuits are constructed from PNP transistors, and said third and fourth current mirror circuits are constructed from NPN transistors.

* * * * *